(12) United States Patent
Parekh et al.

(10) Patent No.: US 10,491,222 B2
(45) Date of Patent: Nov. 26, 2019

(54) SWITCH BETWEEN INPUT REFERENCE CLOCKS OF DIFFERENT FREQUENCIES IN A PHASE LOCKED LOOP (PLL) WITHOUT PHASE IMPACT

(71) Applicant: TEXAS INSTRUMENTS INCORPORATED, Dallas, TX (US)

(72) Inventors: Sinjeet Dhanvantray Parekh, San Jose, CA (US); Eric Paul Lindgren, Bonney Lake, WA (US); Christopher Andrew Schell, Tacoma, WA (US); Jayawardan Janardhanan, Issaquah, WA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/226,938

(22) Filed: Dec. 20, 2018

(65) Prior Publication Data

US 2019/0288694 A1 Sep. 19, 2019

Related U.S. Application Data

(60) Provisional application No. 62/642,036, filed on Mar. 13, 2018.

(51) Int. Cl.
*H03L 7/08* (2006.01)
*H03L 7/089* (2006.01)
(Continued)

(52) U.S. Cl.
CPC .............. *H03L 7/07* (2013.01); *H03K 5/13* (2013.01); *H03L 7/093* (2013.01); *H03K 2005/00234* (2013.01); *H03M 1/50* (2013.01)

(58) Field of Classification Search
CPC . H03L 7/07; H03L 7/093; H03M 1/50; H03K 5/13; H03K 2005/00234
See application file for complete search history.

(56) References Cited

U.S. PATENT DOCUMENTS 5,200,933 A 4/1993 Thornton et al.
5,304,954 A * 4/1994 Saito ...................... H03L 7/113
331/1 A
(Continued)

FOREIGN PATENT DOCUMENTS

EP 0644657 3/1995
EP 3182592 6/2017
(Continued)

OTHER PUBLICATIONS

Michael H. Perrott, "Tutorial on Digital Phase-Locked Loops;" CICC 2009. Sep. 2009 (118 pgs).
(Continued)

*Primary Examiner* — Kenneth B Wells
(74) *Attorney, Agent, or Firm* — John R. Pessetto; Charles A. Brill; Frank D. Cimino (57) ABSTRACT

A phase-locked loop (PLL) includes a selection circuit including a plurality of inputs, each input to receive a separate reference clock. A programmable reference clock divider divides down the reference clock selected by the selection circuit to generate a divided down reference clock. A feedback clock divider divides down an output clock from the PLL to generate a feedback clock. A time-to-digital converter (TDC) generates a digital output value based on a phase difference between the divided down reference clock and the feedback clock. A circuit including a finite state machine, causes, responsive to an indication to change reference clocks, the reference clock divider and the feedback clock divider to be held in a reset state, the divide ratio
(Continued)

of the reference clock divider to be modified, and then to release the reset state.

15 Claims, 5 Drawing Sheets

(51) Int. Cl.
*H03L 7/07* (2006.01)
*H03K 5/13* (2014.01)
*H03L 7/093* (2006.01)
*H03M 1/50* (2006.01)
*H03K 5/00* (2006.01)

(56) References Cited

U.S. PATENT DOCUMENTS

| | | | |
|---|---|---|---|
| 5,796,682 A | 8/1998 | Swapp | |
| 5,959,502 A | 9/1999 | Ovens et al. | |
| 6,308,055 B1* | 10/2001 | Welland | H03L 7/099 331/177 R |
| 6,310,653 B1 | 10/2001 | Malcolm, Jr. et al. | |
| 6,584,574 B1* | 6/2003 | Embree | H03L 7/235 327/156 |
| 6,597,249 B2* | 7/2003 | Chien | H03L 7/099 327/147 |
| 7,126,429 B2 | 10/2006 | Mitric | |
| 7,755,439 B2 | 7/2010 | Yu et al. | |
| 7,876,136 B2 | 1/2011 | Ha et al. | |
| 8,179,174 B2 | 5/2012 | Bunch | |
| 8,368,438 B2* | 2/2013 | Furuta | H03L 7/08 327/147 |
| 8,957,711 B2 | 2/2015 | Jin et al. | |
| 9,020,089 B2 | 4/2015 | Da Dalt | |
| 9,490,820 B2 | 11/2016 | Shiozaki | |
| 9,634,826 B1 | 4/2017 | Park et al. | |
| 9,859,901 B1 | 1/2018 | Chu et al. | |
| 10,075,173 B2 | 9/2018 | Sarda | |
| 10,128,858 B2* | 11/2018 | Goldberg | H04L 7/0331 |
| 10,135,452 B2* | 11/2018 | Cherniak | H03L 7/0991 |
| 10,141,941 B2* | 11/2018 | Petrov | H02M 3/07 |
| 10,185,349 B2* | 1/2019 | Musunuri | G06F 1/08 |
| 10,193,561 B2* | 1/2019 | Lesso | H03L 7/091 |
| 10,200,047 B2 | 2/2019 | Markulic et al. | |
| 10,291,214 B2* | 5/2019 | Thijssen | G06F 1/10 |
| 2007/0085570 A1 | 4/2007 | Matsuta | |
| 2009/0015338 A1 | 1/2009 | Frey | |
| 2009/0219073 A1 | 9/2009 | Sun et al. | |
| 2009/0267664 A1 | 10/2009 | Uozumi et al. | |
| 2011/0234270 A1 | 9/2011 | Kobayashi | |
| 2011/0273210 A1 | 11/2011 | Nagaraj | |
| 2012/0056769 A1 | 3/2012 | Wang et al. | |
| 2012/0161834 A1 | 6/2012 | Lee et al. | |
| 2013/0051290 A1 | 2/2013 | Endo et al. | |
| 2014/0225653 A1 | 8/2014 | Nara et al. | |
| 2014/0266351 A1 | 9/2014 | Na et al. | |
| 2014/0266354 A1 | 9/2014 | Boo et al. | |
| 2015/0077279 A1 | 3/2015 | Song et al. | |
| 2015/0188553 A1 | 7/2015 | Familia et al. | |
| 2015/0372690 A1 | 12/2015 | Tertinek et al. | |
| 2016/0056827 A1 | 2/2016 | Vlachogiannakis et al. | |
| 2016/0156362 A1 | 6/2016 | Kim et al. | |
| 2016/0164532 A1 | 6/2016 | Zhang et al. | |
| 2016/0204787 A1 | 7/2016 | Lotfy et al. | |
| 2016/0238998 A1 | 8/2016 | Pavlovic et al. | |
| 2016/0352506 A1 | 12/2016 | Huang | |
| 2016/0380759 A1 | 12/2016 | Kondo et al. | |
| 2017/0187383 A1 | 6/2017 | Lesso | |
| 2017/0288686 A1 | 7/2017 | Burg et al. | |
| 2018/0269885 A1 | 9/2018 | Kondo et al. | |
| 2018/0351558 A1 | 12/2018 | Kuo et al. | |

FOREIGN PATENT DOCUMENTS

| | | |
|---|---|---|
| JP | H11143570 | 5/1999 |
| JP | 2009260866 | 11/2009 |
| WO | 2015161890 | 10/2015 |

OTHER PUBLICATIONS

Texas Instruments Data Sheet LMK05028 Low-Jitter Dual-Channel Network Synchronizer Clock with EEPROM, Feb. 2018 (94 pages).
International Search Report in corresponding PCT Application No. PCT/US2019/021599 dated May 30, 2019 (2 pages).
International Search Report in corresponding PCT Application No. PCT/US2019/021968 dated Jun. 13, 2019 (2 pages).
International Search Report in corresponding PCT Application No. PCT/US2019/021966 dated Jun. 20, 2019 (2 pages).
International Search Report in corresponding PCT Application No. PCT/US2019/030892 dated Aug. 1, 2019 (3 pages).

* cited by examiner

SWITCH BETWEEN INPUT REFERENCE CLOCKS OF DIFFERENT FREQUENCIES IN A PHASE LOCKED LOOP (PLL) WITHOUT PHASE IMPACT

RELATED APPLICATIONS

This application claims priority to U.S. Provisional Application No. 62/642,036, filed Mar. 13, 2018, which is hereby incorporated by reference.

BACKGROUND

A phase-locked loop (PLL) generates an output clock that the PLL phase locks to an input reference clock. A PLL may include an analog phase-locked loop (APLL) to generate the output clock. The PLL also may include a digital PLL (DPLL). The DPLL includes a time-to-digital converter (TDC) that generates a digital output value that is a function of the phase difference between corresponding edges of the reference clock and a feedback clock derived from the output clock. The digital signal from the TDC is filtered by a digital loop filter and the digital loop filter's output is used to adjust a divide ratio of a frequency divider within the APPL.

SUMMARY

In one example, a phase-locked loop (PLL) includes a selection circuit including a plurality of inputs, each input to receive a separate reference clock. A programmable reference clock divider divides down the reference clock selected by the selection circuit to generate a divided down reference clock. A feedback clock divider divides down an output clock from the PLL to generate a feedback clock. A time-to-digital converter (TDC) generates a digital output value based on a phase difference between the divided down reference clock and the feedback clock. A circuit including a finite state machine, causes, responsive to an indication to change reference clocks, the reference clock divider and the feedback clock divider to be held in a reset state, the divide ratio of the reference clock divider to be modified, and then to release the reset state.

In another example, a method includes dividing down, by a reference clock divider, a reference clock selected by a selection circuit to generate a divided down reference clock and also dividing down, by a feedback clock divider, an output clock from a phase-locked loop (PLL) to generate a feedback clock. The method further includes generating a phase error signal based on a phase difference between the divided down reference clock and the feedback clock. Responsive to an indication to change reference clocks via the selection circuit, the method also includes holding the reference clock divider and the feedback clock divider in a reset state, modifying the divide ratio of the reference clock, and then releasing the reset state.

BRIEF DESCRIPTION OF THE DRAWINGS

For a detailed description of various examples, reference will now be made to the accompanying drawings in which.

DETAILED DESCRIPTION

As noted above, a PLL continually monitors the phase difference between a reference clock and the output clock from the PLL and adjusts the frequency of the VCO to correct for any phase difference. The reference clock may be an externally supplied clock signal to the PLL. In the disclosed examples, the PLL is capable of being provided with multiple reference clocks, one of which is selected via a selection circuit to be used to which to lock the output clock. The frequencies of the reference clocks may vary among the reference clocks. An invalid clock detection circuit monitors the state of each of the reference clocks provided to the selection circuit. The invalid clock detection circuit determines whether each of the reference clocks is valid or invalid. An invalid reference clock means, for example, that a clock edge is too early or too late relative to a target clock edge timing value. A finite state machine (FSM) monitors the status signals from the invalid clock detection circuit and reconfigures the selection circuit to select a different input reference clock if the currently used reference clock is deemed to be invalid.

A reset circuit is also included that receives a reference clock divider reset signal from the FSM. The reference clock divider reset signal causes a reference clock divider to be reset. The reference clock divider divides down the selected reference clock from the selection circuit. The PLL also includes a feedback clock divider, which divides down the output clock from the PLL. The reset circuit generates a feedback clock divider reset signal which causes the feedback clock divider to be reset. Both the reference clock divider reset signal and the feedback clock divider reset signal are asserted so that both the reference clock divider and the feedback clock divider are released from their reset states at the same time. By releasing the clock dividers from their reset states at the same, there is little, if any, phase discontinuity when the FSM switches from one reference clock to another reference clock.

Figure 1:
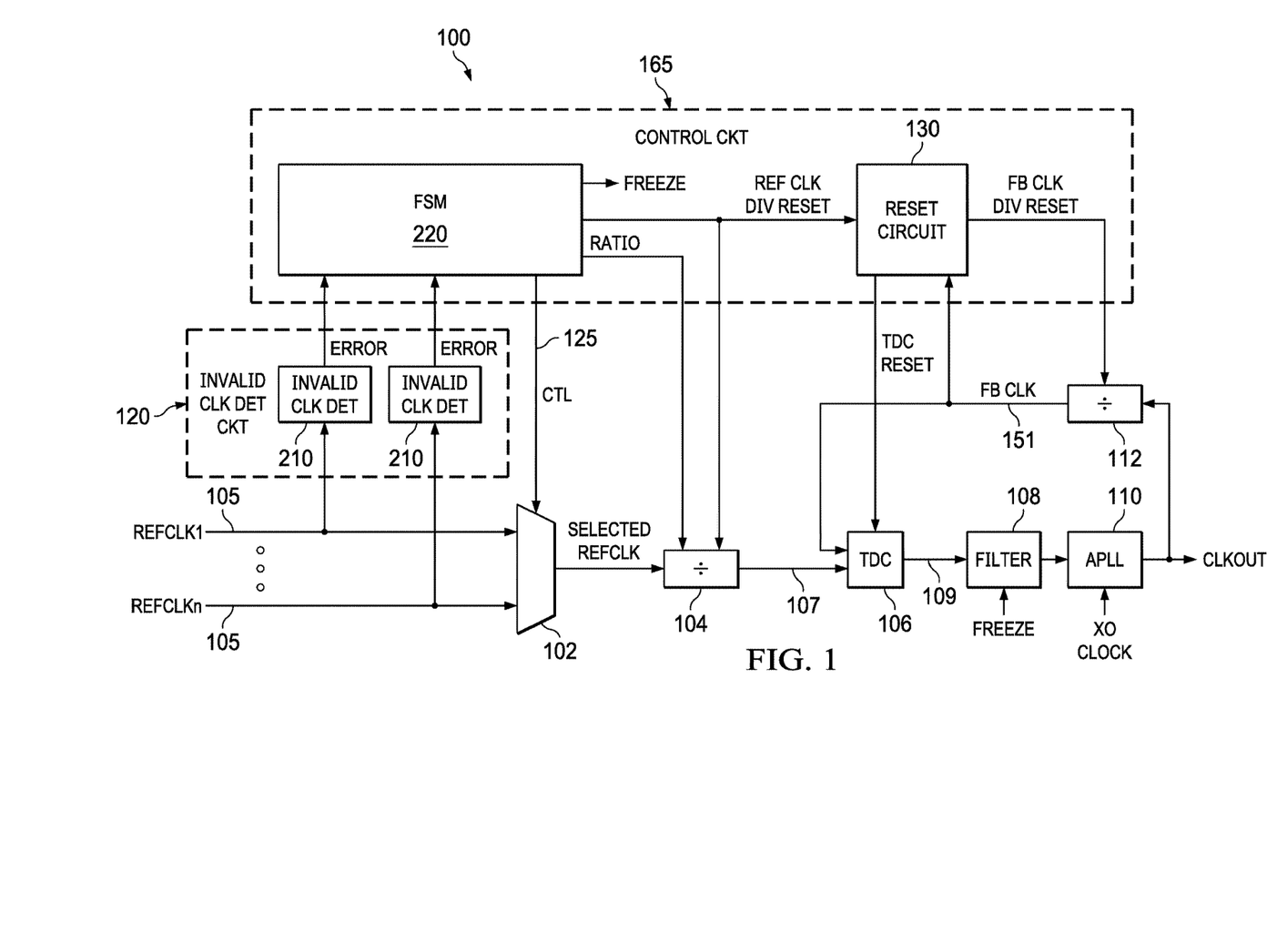
FIG. 1 illustrates a DPLL in accordance with an example.

FIG. 1 shows an example of a PLL 100 which includes a selection circuit 102, a programmable reference clock divider 104, a time-to-digital converter (TDC) 106, a filter 108, an analog phase-locked loop (APLL) 110, a feedback clock divider 112, an invalid clock detection circuit 120, a FSM 220, and a reset circuit 130. The combination of the FSM 220 and the reset circuit 130 in this example comprises a control circuit 165. The combination of the TDC 106, filter 108, and feedback clock divider 112 comprise a digital PLL (DPLL). The selection circuit 102 in this example comprises a multiplexer and thus is referred to herein as multiplexer 102. Multiplexer 102 receives one or more input reference clocks 105-REFCLK1 through REFCLKn. A control signal (CTL) 125 from the FSM configures multiplexer 102 to select one of the reference clocks 105 as a selected reference clock (SELECTED REFCLK) to be provided to the programmable reference clock divider 104.

The programmable reference clock divider 104 divides down the frequency of SELECTED REFCLK by a ratio (RATIO) that is configured by the FSM 220. RATIO is a value that is equal to or greater than 1 and can be an integer value (e.g., 1, 2, etc.) or a fractional value (e.g., 2.5, 10.1, etc.). The output 107 from the programmable reference clock divider 104 is a divided down version of SELECTED REFCLK and is provided to an input of TDC 106. The APLL 110 generates the output clock (CLKOUT) which is to be phase-aligned to SELECTED REFCLK. The feedback clock divider 112 divides down the frequency of CLKOUT by a ratio which may be the same as, or differ from, the ratio implemented by the reference clock divider 104. Further, the frequency ratio implemented by the feedback clock divider 112 may be fixed or programmable. The output from the feedback clock divider 112 is a feedback clock (FB CLK) 151 and is provided to another input of the TDC 106. The TDC 106 determines the phase difference between FBCLK 151 and the divided down reference clock 107 from the reference clock divider 104 and outputs a corresponding phase error value 109. The filter 108 (e.g., a digital filter) receives the TDC's output value and produces a multi-bit digital value (e.g., a frequency control word) to the APLL 110. The multi-bit digital value from the filter configures a frequency divider internal to the APLL 110. A crystal oscillator (XO) clock is the reference clock to the APLL 110 and is used by the APLL 110 to generate CLKOUT. The APLL 110 achieves phase lock of CLKOUT to XO CLK. The TDC 106 continually generates the value 109 based on the phase difference between the divided down reference clock 107 and FBCLK 151, and the filter 108 and APLL 110 react to the phase differences to thereby adjust the frequency of CLKOUT so as to maintain phase-lock with SELECTED REFCLK.

It is possible that the currently selected reference clock 105 becomes invalid. An invalid reference clock 105 may be characterized by an early clock pulse or a late or missing clock pulse. An early clock pulse includes a rising edge of the reference clock that occurs substantially before it should, whereas as a late clock pulse includes a rising edge that occurs substantially after it should. The period of the reference clock is fixed and as long as each subsequent edge occurs within a narrow valid time window, the reference clock is considered to be valid. However, if an edge occurs outside its valid time window (or is missing altogether), the reference clock is considered to be invalid.

The invalid clock detection circuit 120 detects the valid/invalid state of each of the input reference clocks 105 and provides an error signal (ERROR) to the FSM 220. ERROR is asserted to an active state (e.g., logic high) when the corresponding reference clock is deemed to be invalid and is otherwise de-asserted to indicate that the corresponding reference clock is valid. Responsive to receipt of an active ERROR signal corresponding to the currently selected input reference clock 105, the FSM 220 asserts the control signal 125 to cause the multiplexer 102 to select a different reference clock 105 (e.g., a reference clock 105 whose ERROR signal indicates that that clock is valid). The FSM 220 also asserts a FREEZE signal to the filter 108 to cause the filter 108 to hold constant its last output value when an ERROR signal was asserted (e.g., by use of an AND gate to gate off a clock signal to the filter 108). By freezing the filter 108, the frequency of CLKOUT is frozen as well and phase perturbations due to a change in input reference clocks are reduced or eliminated. Further, responsive to an asserted ERROR signal, the FSM 220 also generates a reference clock divider reset (REF CLK DIV RESET) signal to reset the reference clock divider 104. REF CLK DIV RESET is also provided to the reset circuit 130. The reset circuit 130 uses REF CLK DIV RESET, as well as FBCLK, to generate a feedback clock divider reset (FB CLK DIV RESET) signal. FB CLK DIV RESET is a delayed version of REF CLK DIV RESET and is used to reset the feedback clock divider 112. FREEZE is asserted coincident with REF CLK DIV RESET being asserted. In some examples, the FREEZE signal is the REF CLK DIV RESET signal. After the dividers are reset, the FREEZE signal can be de-asserted to unfreeze the filter to thereby permit its output to once again change based on its input value.

When asserted, each reset signal holds its respective frequency divider in a reset state which prevents the frequency divider from outputting its clock signal. For example, when REF CLK DIV RESET is asserted, the reference clock divider 104 holds its output 107 at a constant logic state (e.g., logic low). Similarly, when FB CLK DIV RESET is asserted, the feedback clock divider 112 holds its output at a constant logic state (e.g., logic low). Then, when a reset signal is de-asserted, the corresponding frequency divider is caused to again generate the output clock signal— the reference frequency divider 104 again generates the divided down reference clock signal to the TDC 106 and the feedback frequency divider 112 again generates FBCLK 151 to the TDC. The reset circuit 130 also resets the TDC 106 through assertion of a TDC reset (TDC RESET) signal.

Figure 2:
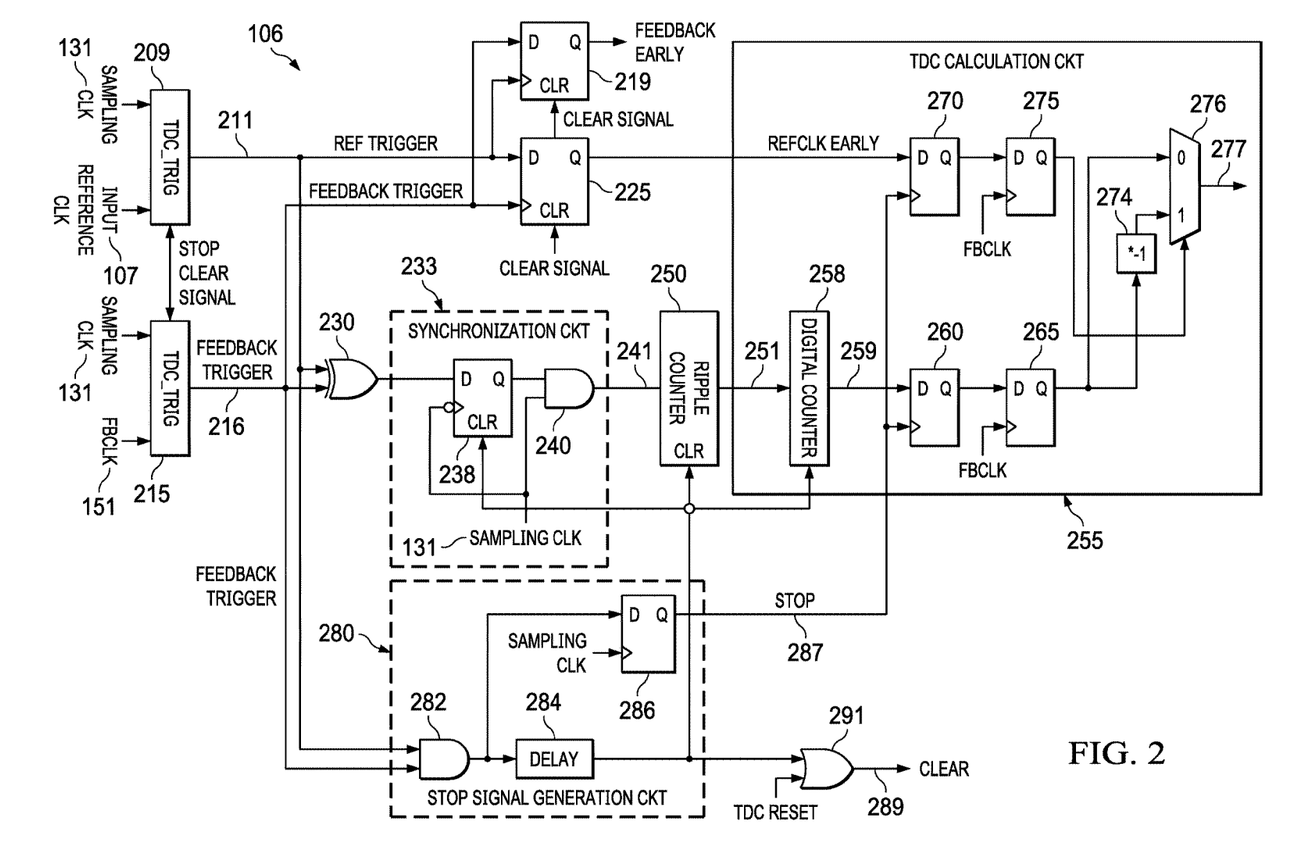
FIG. 2 shows an example schematic of a time-to-digital converter circuit usable in the DPLL of FIG. 1.

FIG. 2 shows an example of an implementation of TDC 106, although other implementations can be used instead. TDC 106 includes TDC trigger circuits (TDC_TRIG) 209 and 215, flip-flops 219 and 225, logic gate 230, synchronization circuit 233, ripple counter 250, TDC calculation circuit 255, and stop signal generation circuit 280. The TDC circuit 106 determines the time difference between corresponding edges of the input reference clock 107 from the reference clock divider 104 and FBCLK 151. For the implementation of TDC 122, the circuit is the same but the output clock 160 is used instead of FBCLK 151. Also, a sampling clock 131 is used to clock the TDC_TRIG circuits 209 and 215.

Referring still to FIG. 2, the divided down reference clock 107 is provided to an input of TDC trigger circuit 209 and FBCLK 151 is provided to an input of TDC trigger circuit 215. Another input of each of the TDC trigger circuits 209, 215 is sampling clock 131. Each trigger circuit 209, 215 synchronizes its input signal (the divided down input reference clock 107 or FBCLK 151) to an edge of the sampling clock 131. The output signal 211 from the TDC trigger circuit 209 is designated as REF TRIGGER and transitions from low to high (or vice versa depending what is considered to be an active edge) when the input reference clock 107 is high when the sampling clock 131 transitions from low to high. That is, the input reference clock 107 transitioning from low to high causes a corresponding transition in REF TRIGGER upon the next active edge of the sampling clock 131. Similarly, the output signal 216 from the TDC trigger circuit 215 is designated as FEEDBACK TRIGGER and transitions from low to high when FBCLK 151 is high when the sampling clock 131 transitions from low to high. That is, FBCLK transitioning from low to high causes a corresponding transition in FEEDBACK TRIGGER upon the next active edge of the sampling clock 131.

Logic gate 230 is shown in the example of FIG. 2 as being an exclusive-OR gate (and is referred to herein as exclusive-OR gate 230), but could be implemented as other logic gates or combinations of logic gates. The inputs of exclusive-OR gate 230 include the REF TRIGGER signal 211 and the FEEDBACK TRIGGER signal 216. The output of the exclusive-OR gate 230 is provided to the synchronization circuit 233. The output of the exclusive-OR gate 230 is a logic high when one, but not both, of the REF TRIGGER and the FEEDBACK TRIGGER signals 211 and 216 are logic high, that is, upon occurrence of the earliest rising edge of the input reference clock 107 or FBCLK 151.

The synchronization circuit 233 includes a D flip-flop 238 and an AND gate 240. The D flip-flop 238 includes a data input (D), a clock input and an output (Q). The output signal from the exclusive-OR gate 230 is provided to the D input of flip-flop 238. The clock sampling 131 is provided to the clock input of the D flip-flop and the output Q is coupled to an input of AND gate 240. The other input of AND gate 240 also receives the sampling clock 131. When the first of the active edge of REF FEEDBACK signal 211 or FEEDBACK TRIGGER signal 216 is received, the output of the exclusive-OR gate 230 becomes a logic high. Upon the next active edge of the sampling clock 131, the logic high on the D input of flip-flop 238 is latched through to the output Q of the flip-flop, and, with sampling clock 131 still being high causes the synchronization output signal 241 of the AND gate 240 to be high. The output of AND gate 240 represents the input to ripple counter 250.

In some examples, the ripple counter 250 is implemented as an asynchronous counter comprising multiple serially-connected flip-flops where an input flip-flop is clocked by an external clock, and each subsequent flip-flop is clocked by the output of the preceding flip-flop. The external clock that clocks the input flip-flop of ripple counter 250 is the synchronization output signal 241 from AND gate 240. The count output 251 of the ripple counter 250 is provided as an input to the TDC calculation circuit 255.

The TDC calculation circuit 255 includes digital counter 258, flip-flops 260, 265, 270, 275, two's complement circuit 274, and a multiplexer 276. The digital counter 258 counts active edges of the output 251 from the ripple counter 250 and provides an output count value 259. The combination of ripple counter 250 and digital counter 258 represents a counter circuit.

Referring still to the TDC example of FIG. 2, stop signal generation circuit 280 includes an AND gate 282, a delay element 284, and a D flip-flop 286. The inputs to AND gate 282 comprise the REF TRIGGER signal 211 and the FEEDBACK TRIGGER signal 216 from the TDC trigger circuits 209 and 215, respectively. When both the REF TRIGGER signal 211 and the FEEDBACK TRIGGER signal 216 are high, the output of AND gate 182 becomes a logic high. Both the REF TRIGGER signal 211 and the FEEDBACK TRIGGER signal 216 being high represents the stop condition when the counting process should cease. The output of the AND gate 282 is latched into D flip-flop 286 upon occurrence of the next active edge of the sampling clock 131. The Q output of D flip-flop 286 represents the STOP signal 287 and is provided to the TDC calculation circuit 255 and used to clock flip-flops 260 and 270. Flip-flop 260 latches in the count value 259 from the digital counter 258 upon occurrence of an active edge of the STOP signal 287. The FBCLK signal is then used to latch the count output of flip-flop 260 by flip-flop 265 to thereby synchronize the count value to the FBCLK.

The delay element 284 delays the output of AND gate 182 to provide a CLEAR signal 289 via OR gate 291. OR gate 291 logically OR's the output of the delay element 284 with the TDC RESET signal from the reset circuit 130 to generate CLEAR 289. The CLEAR signal 289 is essentially a delayed version of the STOP signal 287 with enough of a delay to ensure that the CLEAR signal 289 is asserted high at a time that the count value from the digital counter 258 has been fully latched through flip-flops 260 and 270. The CLEAR signal 289 is provided to the clear inputs of the flip-flop 238, the ripple counter 250, the digital counter 258, and flip-flops 219 and 225. The CLEAR signal 289 resets these components in preparation for the generation of a new count value from the ripple and digital counters 250 and 258.

The active edge of FBCLK may come before or after the corresponding active edge of the divided down reference clock 107. The condition in which the active edge of the input reference clock 107 occurs before the active edge of FBCLK 151 represents a positive count value. The condition in which the input reference clock's active edge occurs after that of FBCLK represents a negative count value. Thus, the count value from the digital counter 258 may need to be modified to, for example, convert it to a negative count value if the active edge of FBCLK precedes that of the input reference clock 107. Flip-flops 219 and 225 are provided to determine whether the count value is to be converted to a negative value. Flip-flop 219 latches the FEEDBACK TRIGGER signal 216 using REF TRIGGER 211 as a clock signal, and flip-flop 225 latches the REF TRIGGER signal 211 using FEEDBACK TRIGGER 216 as a clock signal. The output of flip-flop 219 is designated as the FEEDBACK EARLY signal and when asserted high indicates that the active edge of FBCLK 151 occurred before the corresponding active edge of the input reference clock 107. The output of flip-flop 225 is designated as the REFCLK EARLY signal and when asserted high indicates that the active edge of the input reference clock 107 occurred before the corresponding active edge of FBCLK. In some examples, the FEEDBACK EARLY output signal from flip-flop 220 is not used and in some examples, flip-flop 219 is not present. In some examples, however, the REFCLK EARLY signal from flip-flop 225 is latched into flip-flop 270 of the TDC calculation circuit 255 using the STOP signal 287 and the output of flip-flop 270 is latched into flip-flop 275 using FBCLK 151 to align the REFCLK Early signal to FBCLK.

The output of flip-flop 275 being asserted low indicates that active edge of the input reference clock 107 precedes that of FBCLK 151 and the output of flip-flop 275 being asserted high indicates that FBCLK's active edge precedes that of the input reference clock 107. The output of flip-flop 275 is used as a control signal to control the selection of the inputs to multiplexer 276. One input of multiplexer 276 (the "0" input) is the latched count value from flip-flop 265. The other input to the multiplexer 276 (the "1" input) is the two's complement of the count value from flip-flop 265. The bits of the count value from the flip-flop 265 are converted to a two's complement form by two's complement circuit 274. In one example, the two's complement circuit 274 inverts each of the bits of the output count value from flip-flop 265 and then adds 1 to the least significant bit of that result. The output 277 from the multiplexer 276 represents the count value (either positive or negative) that encodes the time difference between corresponding edges of the input reference clock 107 and FBCLK 151, which is provided to filter 108 as TDC output value 109 (FIG. 1).

Figure 3:
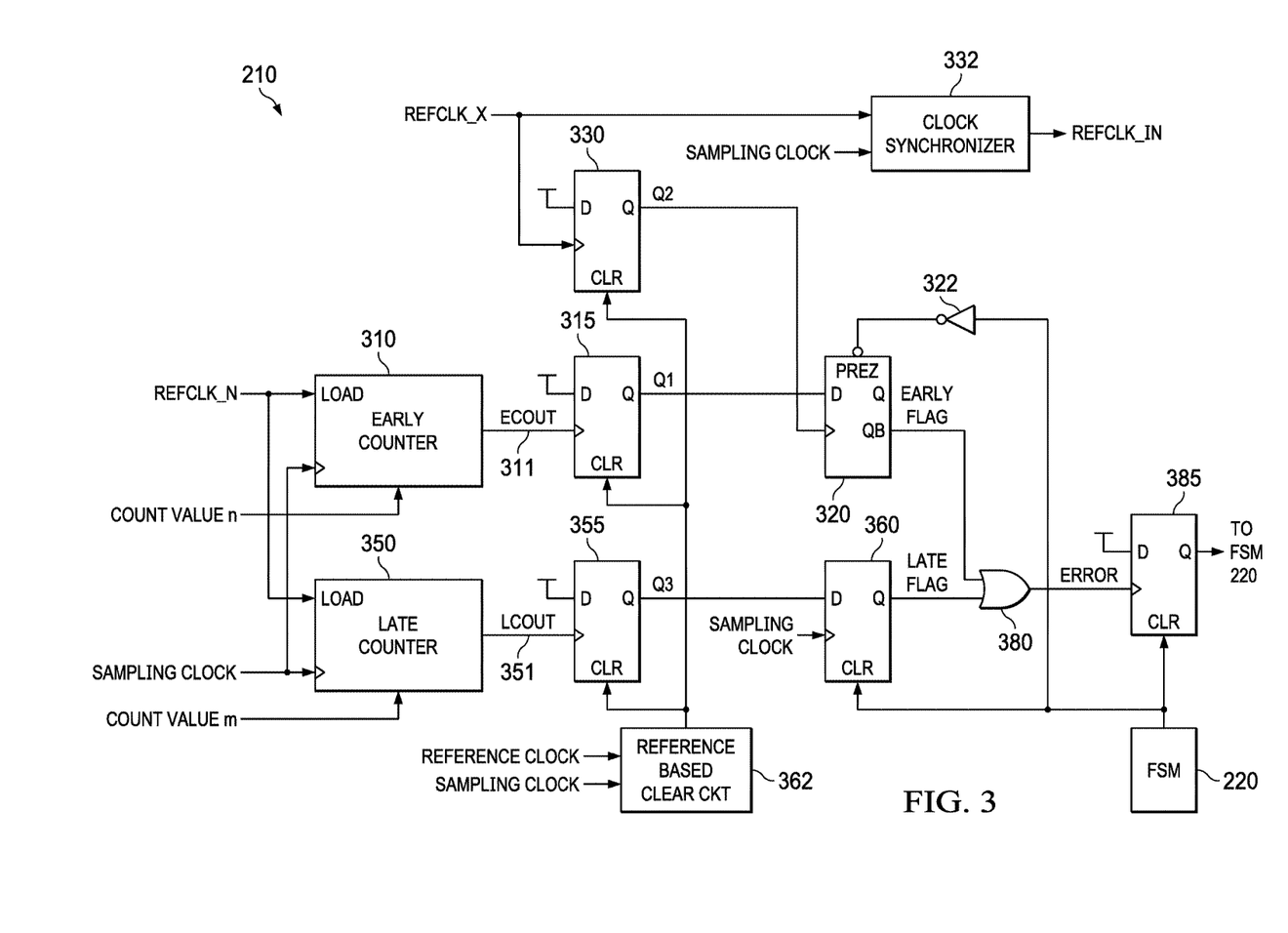
FIG. 3 shows an example schematic of an invalid clock detector circuit usable in the DPLL of FIG. 1.

FIG. 1 illustrates that the invalid clock detector circuit 120 includes an invalid clock detector 210 for each of the input reference clocks 105. FIG. 3 provides an example implementation of each of the invalid clock detectors 210. This example implementation includes an early counter 310, a late counter 350, flip-flops 315, 320, 330, 355, 360, and 385, inverter 322, OR gate 380, clock synchronizer 332, and reference-based clear circuit 362. The example implementation shown in FIG. 3 implements an early time window and a late time window. Each window starts upon detection of a rising edge of the reference clock. The early time window expires before the late time window. The circuit in FIG. 3 detects whether the next reference clock edge occurs before the early time window expires, which represents an early reference clock error condition. The circuit also detects whether the next reference clock edge occurs after expiration of the late time window, which represents a late (or missing) reference clock error condition.

A sampling clock (the same or different clock as the sampling clock 131 used by the TDC 106 in FIG. 2) is provided to clock the early counter 310 and the late counter 350. The clock synchronizer circuit 332 synchronizes REFCLK_x (which is the corresponding reference clock 105 being monitored by the invalid clock detector 210) to the sampling clock and may include one or more flip-flops for this purpose. The output from the clock synchronizer is labeled as REFCLK_IN, which is provided to the load inputs of the early and late counters 310, 350.

Assertion of the load input (e.g., a rising edge of REFCLK_IN) of the counter 310, 350 causes each counter 310, 350 to reset itself to an initial count value and t begin counting pulse of the sampling clock. The initial count value is set to be different between the two counters so as to implement a late window that is longer than an early window. The count value for the early counter 310 is shown as "n" and for the late counter 350 is shown as "m". The value m is larger than the value n in this example.

In the example of FIG. 3, the counters 310, 350 are count-down counters in that, following a reset event, each counter starts counting down from its programming count value (n or m as shown) to zero. The output of each counter 310, 350 is low while counting down until the terminal value (0) is reached, at which point the output is asserted high. That is, when the early counter 310 reaches 0, its output 311 (labeled as early counter output, ECOUT) is asserted. Similarly, when the late counter 350 reaches 0, its output 351 (labeled as late counter output, LCOUT) is asserted. The output 311 of early counter 310 is provided to the clock input of flip-flop 315 and the output 351 of late counter 350 is provided to the clock input of flip-flop 355. The data (D) inputs of both flip-flops 315 and 355 are tied to a logic high level. Thus, if and when the early counter 310 reaches 0, its output transitions from low to high thereby clocking a logic high on the Q output (labeled as Q1) of flip-flop 315. Similarly, if and when the late counter 350 reaches 0, its output transitions from low to high thereby clocking a logic high on the Q output (labeled as Q3) of flip-flop 355.

The Q outputs of flip-flops 315 and 355 are provided to the data inputs of flips-flops 320 and 360, respectively. The sampling clock is used to clock flip-flop 360. Flip-flop 320 is clocked by the Q output (labeled as Q2) of flip-flop 330. The Q bar (QB) output of flip-flop 320 is a signal labeled as EARLY FLAG. Flip-flop 330 is clocked by REFCLK_x. The Q output of flip-flop 360 is a signal labeled as LATE FLAG. Absent an early reference clock, the QB output (EARLY FLAG) of flip-flop 320 is logic low. Similarly, absent a late reference clock, the Q output (LATE FLAG) of flip-flop 360 also is logic low. The data input of flip-flop 330 is tied to a logic high. The Q output of flip-flop 330 transitions from low to high upon a rising edge of REFCLK_X. Flip-flop 330 is used to introduce a small time delay so that a subsequent edge of REFCLK_x is used to clock flip-flop 330 from the edge of REFCLK_x (REFCLK_IN) that resets the early counter 310.

OR gate 380 is coupled to the QB output of flip-flop 320 and the Q output of flip-flop 360 to logically OR together EARLY FLAG and LATE FLAG to generate an ERROR signal. Thus, an asserted ERROR signal indicates the existence of an early or late reference clock error condition, but does not distinguish between the two error conditions. Flip-flop 385 functions as a latch to hold ERROR on its Q output to the FSM 220. The ERROR signal to the FSM 220 can be either the output of OR gate 380 or the latched output from flip-flop 385.

The following discussion explains the use of the early window to detect an early reference clock. For the early reference clock detection, while early counter 310 is counting down, but before its terminal count is reached, the output 311 of the early counter is 0 and the Q output of flip-flop 315 is 0. Flip-flop 320 has been preset by the output of inverter 322 (via FSM 220) and thus its QB output (EARLY FLAG) is logic 0. Upon occurrence of an early reference clock (i.e., a reference clock rising edge that occurs after the early counter 310 has been reset and is counting down but before the early counter 310 reaches 0), flip-flop 330 is clocked thereby forcing its Q output to transition from low to high and clocking flip-flop 320. Flip-flop 320 at this point is clocked with its D input being 0 which then causes EARLY FLAG to transition to a high logic level and ERROR is asserted high via OR gate 380.

The following discussion explains the use of the late window to detect a late reference clock. For the late reference clock detection, while late counter 350 is counting down, but before its terminal count is reached, the output 351 of the late counter is 0 and the Q output of flip-flop 355 is 0. Flip-flop 360 has been cleared by the FSM 220, and thus its Q output (LATE FLAG) is logic 0. Once the late counter 350 counts down to 0, flip-flop 355 is then clocked thereby forcing the Q output of flip-flop 355 to a logic high level, which in turn forces the Q output of flip-flop 360 (LATE) FLAG to become logic high upon the next rising edge of the sampling clock. OR gate 380 then causes its ERROR output signal to become logic high in response to LATE FLAG being high. Had the next rising edge of REFCLK_x occurred before the late counter 350 expired, the late counter 350 would have been reset by the REFCLK_x edge and not permitted to count down to 0. The reference-based clear circuit 362 generates a clear signal to clear flip-flops 330, 315 and 355 responsive to either each rising edge of REFCLK_IN or the sampling clock.

Figure 4:
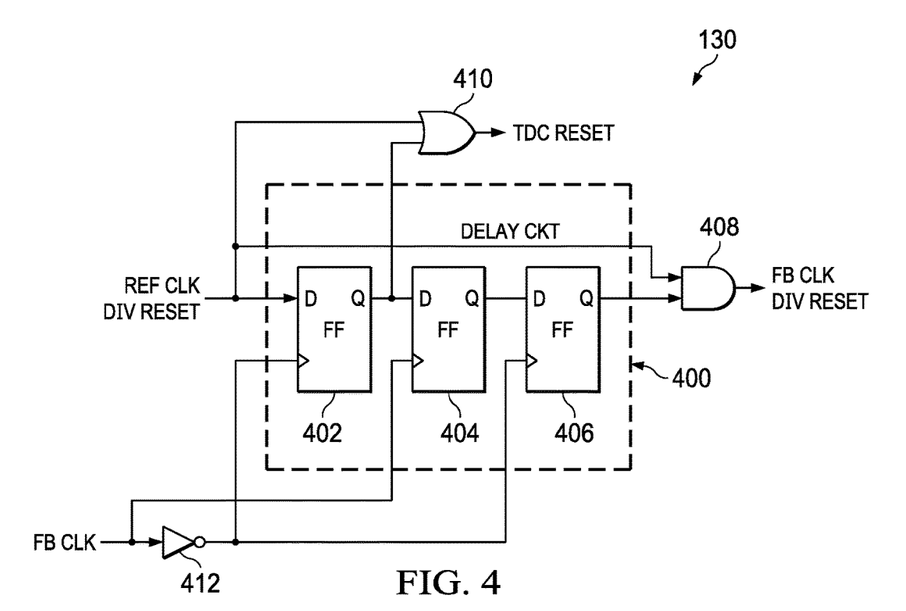
FIG. 4 shows an example schematic of a reset circuit usable in the DPLL of FIG. 1.

FIG. 4 shows an example schematic for reset circuit 130. This example includes a delay circuit 400, AND gate 408, OR gate 410, and inverter 412. The delay circuit 400 receives REF CLK DIV RESET as an input and produces FB CLK DIV RESET as an output, where FB CLK DIV RESET is a delayed version of REF CLK DIV RESET. In the example of FIG. 4, the delay circuit includes multiple serially-connected flip-flops 402, 404, and 406. Three flip-flops are shown in this example, but a different number of flip-flops can be included in other examples. REF CLK DIV RESET is coupled to the D input of flip-flop 402 and the Q output of flip-flop 402 is coupled to the D input of flip-flop 404. The Q output of flip-flop 404 is coupled to the D input of flip-flop 406. The AND gate includes one input that is coupled to the Q output of flip-flop 406, and another input that receives REF CLK DIV RESET. In this example, the flip-flops 402 and 406 are clocked by inverted version of FBCLK and flip-flop 404 is clocked by FBCLK which reduces delay, but all three flip-flops could be clocked by the same clock in other examples. The output of the AND gate 408 (FB CLK DIV RESET) is logic high only when both REF CLK DIV RESET and the Q output of flip-flop 406 are high. That is, FB CLK DIV RESET transitions from low to high when the delayed version of REF CLK DIV RESET becomes high and FB CLK DIV RESET transitions back to low when REF CLK DIV RESET again goes low.

The OR gate 410 logically OR's together REF CLK DIV RESET and the signal from the Q output of the first flip-flop in the series chain (i.e., flip-flop 402). By OR'ing together these two signals, TDC RESET becomes high when REF CLK DIV RESET goes high and TDC RESET goes a clock cycle of FBCLK after REF CLK DIV RESET goes low. Thus, TDC RESET is a slightly stretched version of REF CLK DIV RESET.

Figure 5:
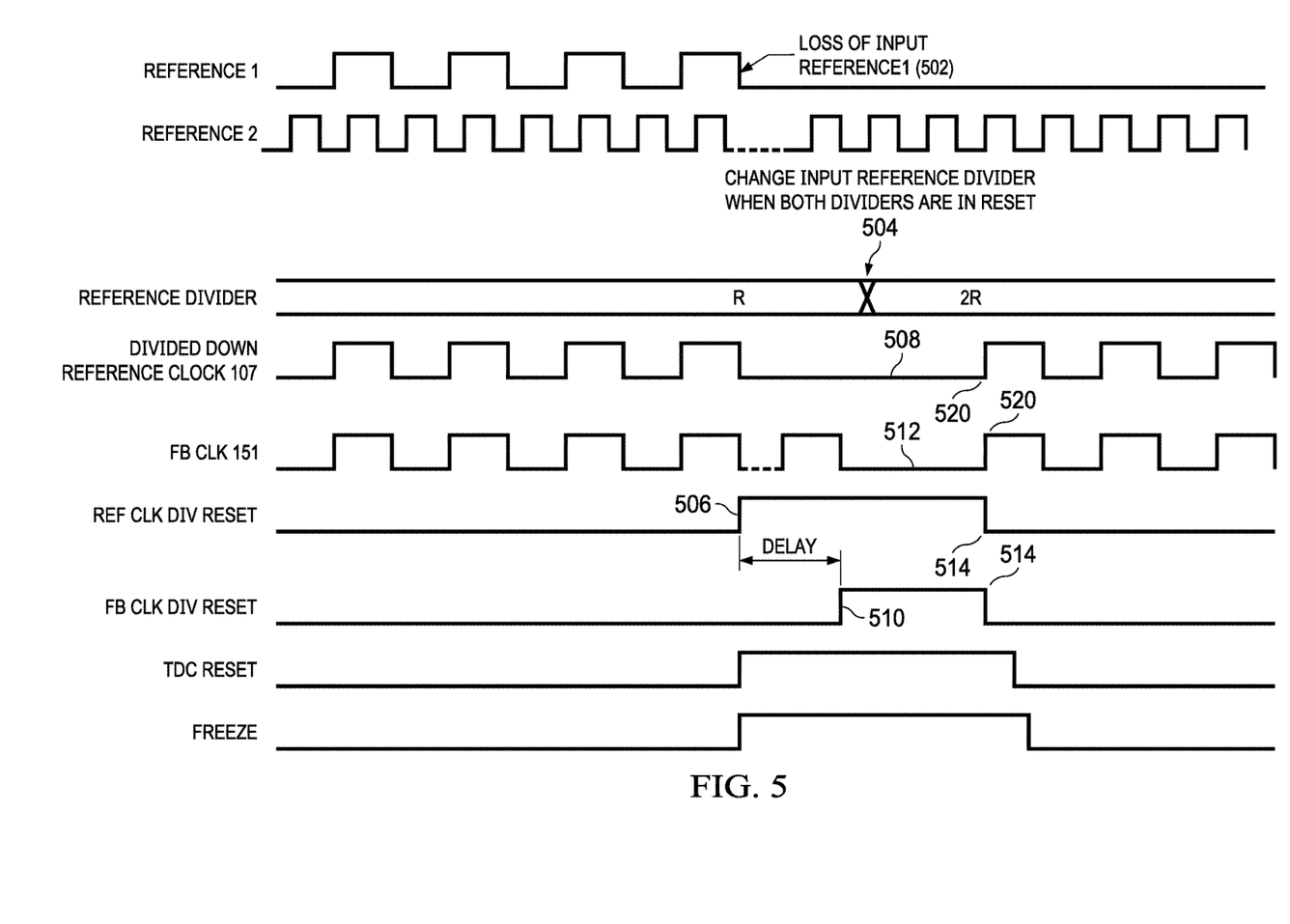
FIG. 5 is a timing diagram of various signals with the DPLL of FIG. 1.

FIG. 5 shows a timing diagram of various signals discussed above. Two example reference clocks are shown as REFERENCE 1 and REFERENCE 2. In this example, the frequency of REFERENCE 1 is different (lower) than the frequency of REFERENCE 2. In general, the frequency of the reference clocks 105 to the multiplexer 102 in FIG. 1 need not be the same, and need not even be integer multiples of each other. REFERENCE 1 in this example is the currently used reference clock for the DPLL (i.e., REFERENCE 1 is selected via multiplexer 102).

At 502, REFERENCE 1 becomes invalid. In this example, REFERENCE 1 transitions low and remains low beginning at 502. The invalid clock detector 210 monitoring REFERENCE 1 detects this error condition (missing clock) and asserts its ERROR signal to the FSM 220. In response, the FSM 220 reconfigures multiplexer 102 (504) to select a new reference clock (REFERENCE 2) and reconfigures RATIO for the reference clock divider 104. The new value of RATIO corresponds to the frequency of Reference 2. In the example of FIG. 5, the value of RATIO for REFERENCE 1 is 1 (divide by 1) and the value of RATIO for REFERENCE 2 is 2 (divide by 2).

Also upon receipt of ERROR, the FSM 220 asserts REFCLK DIV RESET (506) to reset the reference clock divider 104. Resetting the reference clock divider 104 causes its output to cease (become logic low) as shown at 508. The output of the reference clock divider 104 remains low as long as REF CLK DIV RESET is high. Following a time delay (DELAY) created by the reset circuit 130, the reset circuit 130 asserts FB CLK DIV RESET to a logic high state at 510. By asserting FB CLK DIV RESET, the feedback clock divider 112 is reset. Resetting the feedback clock divider 12 causes its output to cease (become logic low) as shown at 212. The output of the feedback clock divider 112 remains low as long as FB CLK DIV RESET is high.

Both reset signals (REF CLK DIV RESET and FB CLK DIV RESET) are de-asserted at 514. De-asserting both reset signals releases the corresponding frequency dividers 104, 112 from their reset states which again causes the dividers to output their divided down output clocks (divided down reference clock 107 and FBCLK 151) as shown at 520. The divided down reference clock 107 and FBCLK 151 are generally phase-aligned at this point and are reset at the same time synchronous to the new reference clock (REFERENCE 2). By resetting the two frequency dividers at the same time, no phase jump will be present on the DPLL output clock, and the DPLL will not need to be re-calibrated.

FIG. 5 also shows the TDC RESET and FREEZE signals. The reset circuit generates TDC RESET as explained above. TDC RESET is asserted high responsive to REF CLK DIV RESET being asserted and is de-asserted slightly after REF CLK DIV RESET becomes low. When asserted, the TDC RESET signal causes CLEAR 289 in FIG. 2 to be asserted thereby clearing the flip-flops 219, 225, 238, and ripple counter 250 and digital counter 258 as shown in FIG. 2. The FREEZE signal is asserted to a high logic state in this example generally commensurate with REF CLK DIV RESET being asserted high and is de-asserted either a clock cycle after REF CLK DIV RESET is pulled low (514) or at the same time that REF CLK DIV RESET is pulled low. Deasserting FREEZE causes the filter's output to once again change.

In this description, the term "couple" or "couples" means either an indirect or direct connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Modifications are possible in the described embodiments, and other embodiments are possible, within the scope of the claims.

What is claimed is:

1. A phase-locked loop (PLL), comprising:
 a selection circuit including a plurality of inputs, each input to receive a separate reference clock;
 a programmable reference clock divider to divide down the reference clock selected by the selection circuit to generate a divided down reference clock;
 an analog phase-locked loop (APLL) to generate an output clock;
 a feedback clock divider coupled to an output of the APLL, the feedback clock divider to divide down the output clock to generate a feedback clock;
 a time-to-digital converter (TDC) coupled to an output of the reference clock divider and an output of the feedback clock divider, the TDC to generate a digital output value based on a phase difference between the divided down reference clock and the feedback clock;
 an invalid clock detection circuit to detect whether each of the reference clocks provided to the selection circuit is valid or invalid, wherein, for a reference clock detected by the invalid clock detection circuit to be invalid, the invalid clock detection circuit is to assert an error signal; and
 a circuit including a finite state machine, the circuit to cause, responsive to assertion of the error signal for a current reference clock, the reference clock divider and the feedback clock divider to be held in a reset state, the divide ratio of the reference clock divider to be modified, and then to release the reset state.

2. The PLL of claim 1, wherein the circuit including the finite state machine also includes a delay circuit to generate a feedback clock divider reset signal that is a delayed version of a reference clock divider reset signal, wherein the feedback clock divider reset signal resets the feedback clock divider and the reference clock divider reset signal resets the programmable reference clock divider.

3. The PLL of claim 2, wherein the delay circuit comprises a plurality of serially-connected flip-flops.

4. The PLL of claim 2, wherein:
 while the feedback clock divider reset signal is asserted to an active state, the output of the feedback clock divider is held at a constant logic state; and
 while the reference clock divider reset signal is asserted to an active state, the output of the programmable reference clock divider is held at a constant logic state.

5. The PLL of claim 4, wherein upon de-assertion of the feedback clock divider reset signal, the feedback clock divider again outputs the feedback clock, and wherein upon de-assertion of the reference clock divider reset signal, the programmable reference clock divider again outputs the divided down reference clock.

6. The PLL of claim 1, wherein the circuit including the finite state machine causes the reference clock divider and the feedback clock to be held in a reset state based on the error signal and the feedback clock.

7. The PLL of claim 1, wherein at least two of the reference clocks to the selection circuit have different frequencies.

8. The PLL of claim 1, wherein the divide ratio is a value of 1 or greater.

9. The PLL of claim 1, wherein, responsive to assertion of the error signal, the circuit including the finite state machine asserts a signal to a filter to freeze an output of the filter.

10. The PLL of claim 9, wherein, upon release of the reset state of the reference clock divider and the feedback clock divider, the circuit including the finite state machine de-asserts the signal to the filter to unfreeze the output of the filter.

11. A phase-locked loop (PLL), comprising:
a selection circuit including a plurality of inputs, each input to receive a separate reference clock;
a programmable reference clock divider to divide down the reference clock selected by the selection circuit to generate a divided down reference clock;
a feedback clock divider to divide down an output clock from the PLL to generate a feedback clock;
a time-to-digital converter (TDC) coupled to an output of the reference clock divider and an output of the feedback clock divider, the TDC to generate a digital output value based on a phase difference between the divided down reference clock and the feedback clock;
a circuit including a finite state machine, the circuit to cause, responsive to an indication to change reference clocks, the reference clock divider and the feedback clock divider to be held in a reset state, the divide ratio of the reference clock divider to be modified, and then to release the reset state;
further comprising an invalid clock detection circuit to detect whether each of the reference clocks provided to the selection circuit is valid or invalid, wherein, for a reference clock detected by the invalid clock detection circuit to be invalid, the invalid clock detection circuit is to assert an error signal.

12. The PLL of claim 11, wherein the circuit including the finite state machine causes, responsive to the error signal from the invalid clock detection circuit, the reference clock divider and the feedback clock divider to be held in the reset state and the divide ratio of the reference clock divider to be modified.

13. A phase-locked loop (PLL), comprising:
a selection circuit including a plurality of inputs, each input to receive a separate reference clock;
a programmable reference clock divider to divide down the reference clock selected by the selection circuit to generate a divided down reference clock;
a feedback clock divider to divide down an output clock from the PLL to generate a feedback clock;
a time-to-digital converter (TDC) coupled to an output of the reference clock divider and an output of the feedback clock divider, the TDC to generate a digital output value based on a phase difference between the divided down reference clock and the feedback clock;
a circuit including a finite state machine, the circuit to cause, responsive to an indication to change reference clocks, the reference clock divider and the feedback clock divider to be held in a reset state, the divide ratio of the reference clock divider to be modified, and then to release the reset state;
wherein the circuit including the finite state machine also includes a delay circuit to generate a feedback clock divider reset signal that is a delayed version of a reference clock divider reset signal, wherein the feedback clock divider reset signal resets the feedback clock divider and the reference clock divider reset signal resets the programmable reference clock divider.

14. A phase-locked loop (PLL), comprising:
a selection circuit including a plurality of inputs, each input to receive a separate reference clock;
a programmable reference clock divider to divide down the reference clock selected by the selection circuit to generate a divided down reference clock;
a feedback clock divider to divide down an output clock from the PLL to generate a feedback clock;
a time-to-digital converter (TDC) coupled to an output of the reference clock divider and an output of the feedback clock divider, the TDC to generate a digital output value based on a phase difference between the divided down reference clock and the feedback clock;
a circuit including a finite state machine, the circuit to cause, responsive to an indication to change reference clocks, the reference clock divider and the feedback clock divider to be held in a reset state, the divide ratio of the reference clock divider to be modified, and then to release the reset state;
wherein, responsive to an indication to change reference clocks, the circuit including the finite state machine asserts a signal to a filter to freeze an output of the filter.

15. The PLL of claim 14, wherein, upon release of the reset state of the reference clock divider and the feedback clock divider, the circuit including the finite state machine de-asserts the signal to the filter to unfreeze the output of the filter.

* * * * *